United States Patent
Chandler et al.

(10) Patent No.: US 9,150,961 B2
(45) Date of Patent: Oct. 6, 2015

(54) GAS DELIVERY FOR BEAM PROCESSING SYSTEMS

(75) Inventors: Clive D. Chandler, Portland, OR (US);
Steven Randolph, Portland, OR (US);
Gavin Hartigan, Portland, OR (US)

(73) Assignee: FEI Company, Hillsboro, OR (US)

( * ) Notice: Subject to any disclaimer, the term of this patent is extended or adjusted under 35 U.S.C. 154(b) by 943 days.

(21) Appl. No.: 12/947,669

(22) Filed: Nov. 16, 2010

(65) Prior Publication Data

US 2011/0114665 A1    May 19, 2011

Related U.S. Application Data

(60) Provisional application No. 61/261,622, filed on Nov. 16, 2009.

(51) Int. Cl.
*C23C 16/04* (2006.01)
*C23C 16/448* (2006.01)
*C23C 16/455* (2006.01)

(52) U.S. Cl.
CPC ........... *C23C 16/047* (2013.01); *C23C 16/4485* (2013.01); *C23C 16/45523* (2013.01); *C23C 16/45561* (2013.01); *H01J 2237/006* (2013.01)

(58) Field of Classification Search
CPC .............. C23C 16/047; C23C 16/4485; C23C 16/45523; C23C 16/45561; C23C 16/455; H01J 2237/006; H01J 37/3244; H01J 37/32834
USPC ........................ 118/715, 723 FE, 723 FI, 726; 156/345.29, 345.33, 345.39, 345.4
See application file for complete search history.

(56) References Cited

U.S. PATENT DOCUMENTS

| | | | | |
|---|---|---|---|---|
| 4,681,119 A | * | 7/1987 | Rasor et al. | 424/9.52 |
| 4,847,469 A | * | 7/1989 | Hofmann et al. | 392/397 |
| 4,851,097 A | * | 7/1989 | Hattori et al. | 204/192.33 |
| 5,055,696 A | | 10/1991 | Haraichi et al. | |
| 5,188,705 A | * | 2/1993 | Swanson et al. | 204/192.34 |
| 5,242,110 A | * | 9/1993 | Riley | 239/11 |
| 5,376,791 A | * | 12/1994 | Swanson et al. | 850/63 |
| 5,435,850 A | | 7/1995 | Rasmussen | |
| 5,683,547 A | | 11/1997 | Azuma et al. | |
| 5,702,530 A | * | 12/1997 | Shan et al. | 118/723 MP |
| 5,827,786 A | * | 10/1998 | Puretz | 438/789 |
| 5,851,413 A | | 12/1998 | Casella et al. | |
| 6,116,224 A | * | 9/2000 | Cook et al. | 123/568.27 |

(Continued)

FOREIGN PATENT DOCUMENTS

| | | |
|---|---|---|
| EP | 1465243 | 10/2004 |
| JP | 62-149881 | 7/1987 |

(Continued)

*Primary Examiner* — Jeffrie R Lund
(74) *Attorney, Agent, or Firm* — Scheinberg & Associates, PC; Michael O. Scheinberg; John B. Kelly

(57) ABSTRACT

Gas flow from multiple gas sources into a sample chamber of a beam system is controlled by a cycling valve for each gas source, with the gas pressure in the sample chamber being determined by the relative time that the valve is opened and the upstream pressure at the valve. A gas valve positioned inside the vacuum chamber allows rapid response in shutting off a gas. In some preferred embodiments, a precursor gas is supplied from a solid or liquid material in a container that remains outside the vacuum system while in use and which is readily connected or disconnected to the gas injection system without significant leakage.

17 Claims, 8 Drawing Sheets

(56) References Cited

U.S. PATENT DOCUMENTS

| | | |
|---|---|---|
| 6,361,744 B1 | 3/2002 | Levy |
| 6,849,133 B2 * | 2/2005 | Campbell et al. ............. 118/715 |
| 7,238,294 B2 | 7/2007 | Koops et al. |
| 7,452,477 B2 * | 11/2008 | Koops et al. .................... 216/62 |
| 7,482,603 B2 | 1/2009 | Tomimatsu et al. |
| 7,504,182 B2 | 3/2009 | Stewart et al. |
| 7,537,708 B2 | 5/2009 | Koops et al. |
| 7,732,308 B2 | 6/2010 | Schumacher et al. |
| 8,623,230 B2 * | 1/2014 | Auth et al. ...................... 216/64 |
| 2003/0033980 A1 * | 2/2003 | Campbell et al. ............. 118/715 |
| 2004/0033425 A1 * | 2/2004 | Koops et al. ...................... 430/5 |
| 2004/0086642 A1 | 5/2004 | Kesala |
| 2004/0173759 A1 | 9/2004 | Koops et al. |
| 2005/0072753 A1 * | 4/2005 | Koops et al. ...................... 216/2 |
| 2005/0217584 A1 * | 10/2005 | Abiko et al. .................. 118/726 |
| 2005/0230615 A1 * | 10/2005 | Furutani et al. ............... 250/287 |
| 2006/0121211 A1 * | 6/2006 | Choi .............................. 427/569 |
| 2006/0144332 A1 | 7/2006 | Sweeney et al. |
| 2007/0261735 A1 | 11/2007 | Yasumuro et al. |
| 2008/0011718 A1 * | 1/2008 | Koops et al. ..................... 216/94 |
| 2008/0149031 A1 * | 6/2008 | Chu et al. ...................... 118/726 |
| 2008/0191153 A1 | 8/2008 | Marganski et al. |
| 2008/0296523 A1 * | 12/2008 | Gianchandani et al. . 251/129.06 |
| 2009/0211525 A1 * | 8/2009 | Sarigiannis et al. .......... 118/707 |
| 2009/0223451 A1 | 9/2009 | Kruger et al. |
| 2009/0232986 A1 * | 9/2009 | Choi et al. ................. 427/255.28 |
| 2010/0032567 A1 | 2/2010 | Maclou Botman et al. |
| 2010/0043888 A1 * | 2/2010 | Sneh ................................ 137/14 |
| 2010/0102223 A1 * | 4/2010 | Albiez et al. .................. 250/307 |
| 2010/0112815 A1 * | 5/2010 | O'Dougherty et al. ....... 438/689 |
| 2010/0197142 A1 | 8/2010 | Randolph et al. |
| 2010/0200016 A1 * | 8/2010 | Yancey .......................... 134/1.1 |
| 2010/0224592 A1 | 9/2010 | Toth et al. |
| 2011/0031655 A1 | 2/2011 | Toth et al. |
| 2011/0070381 A1 | 3/2011 | Toth et al. |
| 2011/0114665 A1 * | 5/2011 | Chandler et al. ................... 222/1 |
| 2011/0115129 A1 | 5/2011 | Straw et al. |
| 2012/0090545 A1 * | 4/2012 | Chiang et al. ................. 118/719 |

FOREIGN PATENT DOCUMENTS

| | | | |
|---|---|---|---|
| JP | 62-158872 | 7/1987 | |
| JP | 01129256 A * | 5/1989 | ............... G03F 1/00 |
| JP | H01-129256 | 5/1989 | |
| JP | H03-166723 | 7/1991 | |
| JP | H11-016772 | 1/1999 | |
| JP | 11086772 | 3/1999 | |
| JP | 2001-351560 | 12/2001 | |
| WO | 9215112 | 9/1992 | |
| WO | WO9738355 | 10/1997 | |

\* cited by examiner

GAS DELIVERY FOR BEAM PROCESSING SYSTEMS

This Application claims priority from U.S. Provisional Application 61/261,622, filed Nov. 16, 2009, which is hereby incorporated by reference.

TECHNICAL FIELD OF THE INVENTION

The present invention relates to systems for providing a gas for a beam processing system, ion beam or electron beam system.

BACKGROUND OF THE INVENTION

Beam systems, such as electron beam systems, ion beam systems, laser beam systems, cluster beam system, and neutral particle beam systems, are used to create features on a surface by etching or deposition. Beam-induced deposition processes use a precursor gas that reacts in the presence of the beam to deposit material on the surface in areas where the beam impacts. For example, a gaseous organometallic compound, such as tungsten hexcarbonyl, is provided near the sample and is adsorbed onto the surface. The organometallic compound decomposes in the presence of a charged particle beam, such as an ion beam or an electron beam, to form a metal that remains on the surface and a volatile organic compound that is removed by a vacuum pump. Etching processes use a precursor gas that reacts with the surface of the work piece to form a volatile compound. For example, iodine can be used to etch a silicon wafer. The iodine reacts in the presence of the beam to form a volatile silicon iodine compound, which leaves the sample surface and is removed by the vacuum pump.

Precursor gases are introduced into the vacuum by a "gas injection system" or "GIS." Gas injection systems typically include a gas source and a gas director, such as a needle or funnel, that is positioned near the sample and directs the gas toward the work piece. A precursor gas that is generated from a material that is solid or liquid at room temperature is typically supplied from a crucible within the vacuum chamber. The flow of gas is generated by heating the solid or liquid to increase its vapor pressure, causing gas to flow through the gas director and into the vacuum chamber. For example, tungsten hexacarbonyl is a solid at room temperature and is typically heated to about 55° C. or 60° C. to raise its vapor pressure to cause a suitable flow into a vacuum chamber.

One prior art system is described, for example in, U.S. Pat. No. 5,435,850 to Jorgen Rasmussen for a "Gas Injection System." The gas injection system of Rasmussen includes a crucible in which a solid or liquid source material is stored. The crucible is positioned within the vacuum chamber. The crucible is heated to increase the vapor pressure of the source material, and the gas from the source material then flows to the sample. The gas flow is regulated by the amount of heat supplied to the crucible and by positioning a plunger within a valve to control the size of the valve opening. The limited crucible capacity requires frequent refilling of the crucible in many applications. The dangerous nature of some of the precursor chemicals necessitates special safety equipment during refilling, which equipment may not be readily available in the field. Such systems also require realignment after each refill so that the needle is pointing toward the impact point of the charged particle beam. Controlling the temperature and the valve opening provides a limited ability to control the pressure within the sample chamber of the charged particle beam system.

Another type of gas injection system is described in U.S. Pat. No. 5,851,413 to Casella for a "Gas Delivery Systems for Particle Beam Processing." In the systems of Casella, the precursor is stored outside the vacuum chamber, and flows through a conduit into a gas concentrator near the sample. Systems that store the precursor gas outside the vacuum chamber typically include a valve, such as a stepper-motor-controlled diaphragm valve, to control the gas flow.

Control of pressure of the precursor gas in the charged particle beam sample chamber is limited in prior art systems because the pressure is controlled only by the controlling the temperature of the gas source or the degree of opening of the diaphragm valve. A vacuum pump is continually removing gas from the sample chamber, and so the pressure in the equilibrium chamber is reached when the gas flow in is equal to the gas flow out. Apertures are required in the input gas path to restrict the flow so that a low pressure can be maintained in the sample chamber. Such apertures, however, increase the time required to bring the sample chamber up to the desired operating pressure.

FIG. 1 shows a typical prior art diaphragm valve 100 used in a gas injection system. Valve 100 includes a valve body 102 and an actuator, such as a stepper motor 104 or a pneumatic valve that controls the position of a valve stem 106 that positions a diaphragm 108 over a seat 110 at an opening in a supply pipe 112. When the valve stem 106 presses the diaphragm against the opening in seat 110, no gas flows through the opening. When the valve stem moves away from the opening, as shown in FIG. 1, the diaphragm allows gas to flow into the valve from supply pipe 112 and out of the valve through outlet pipe 114. Pressure is measured at exit of gas system and then correlated using a calibration table to feed back to control system.

The diaphragm valve is operated in a partially open position, with the flow dependent on the degree of opening and the upstream gas pressure. Once the degree of opening that provides the desired chamber pressure is determined, the valve typically remains in that position, unless the pressure in the chamber needs adjustment. The flow control is coarse and the position of the valve stem is not highly correlated to a flow rate. That is, a valve setting that provides a first sample pressure chamber on the first system will not necessarily provide the same pressure on a second system. In such processes, it is preferably to maintain a desired ratio between process gases. It can be difficult to maintain the desired ratio when control of each component is inexact.

US Pat. Pub. No. 2009/0223451 describes a system for delivering precursor gases to a beam instrument. The system uses a carrier gas to dilute and carry the precursor gases from one or more crucibles though a single main line to a needle and into the sample vacuum chamber. Flow of the carrier gas and the gas from each crucible is controlled in part by controlling the duty cycle of a pneumatic valve. Part of each crucible and the main line are in a gas envelope that opens to the sample vacuum chamber. Use of a single main line leaves precursor gas in the main line when the crucible valve is closed, thereby requiring a purging procedure for the main line, which takes time and wastes precursor gas.

SUMMARY OF THE INVENTION

An object of the invention is to improve gas flow control for beam-assisted processes.

In accordance with some preferred embodiments, gas flow from multiple gas sources into a sample chamber of a beam system is controlled by a cycling valve for each gas source, with the gas pressure in the sample chamber being determined by the relative time that the valve is opened and the upstream pressure at the valve. A gas valve positioned inside the vacuum chamber allows rapid response in shutting off a gas.

In accordance with some preferred embodiments, a precursor gas is supplied from a solid or liquid material in a container that remains outside the vacuum system while in use and which is readily connected or disconnected to the gas injection system without significant leakage.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

In accordance with a preferred embodiment of the present invention, the gas flow into a sample chamber of a beam system is controlled by a "cycling" valve, such as a microvalve. A cycling valve, as used herein, means a valve that controls a flow by cycling between an open position and closed position, with the flow being controlled by the fraction of time during a given period that the valve is open. By cycling the valve rapidly, typically at a frequency greater than one Hertz, the gas flow can be averaged out to the extent required by the application. Both the time that the valve remains open during each cycle and the number of cycles per second, that is, the cycle frequency can be adjusted to control the gas flow through the valve. The percentage of time that the valve is open is referred to a "duty cycle." The flow will also be determined, of course, by the pressure difference across the valve. In most applications the pressure in the sample chamber is much lower than the gas pressure on the input side of the valve and so the flow is determined primarily by the pressure on the input side of the valve.

Figure 1:
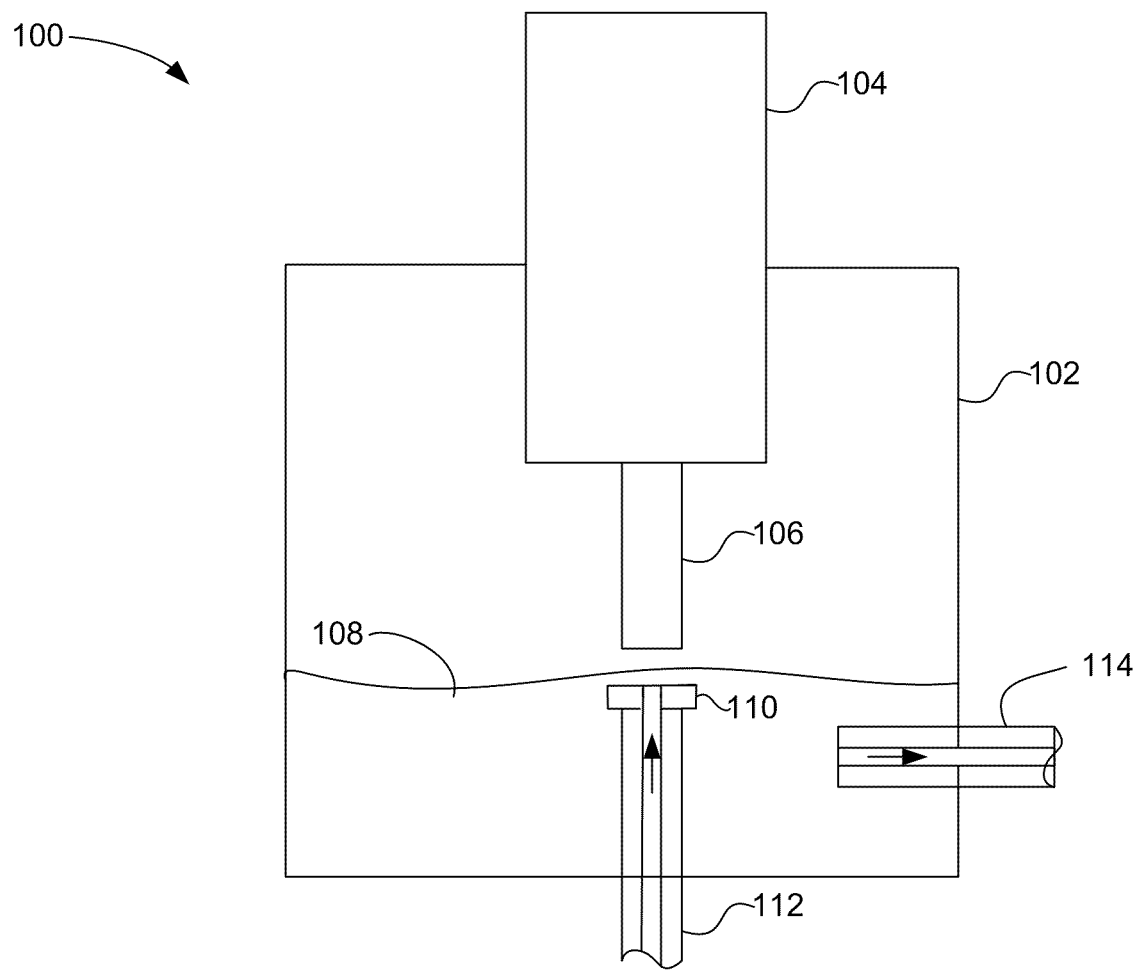
FIG. 1 shows a schematically a prior art diaphragm valve.
Figure 2:
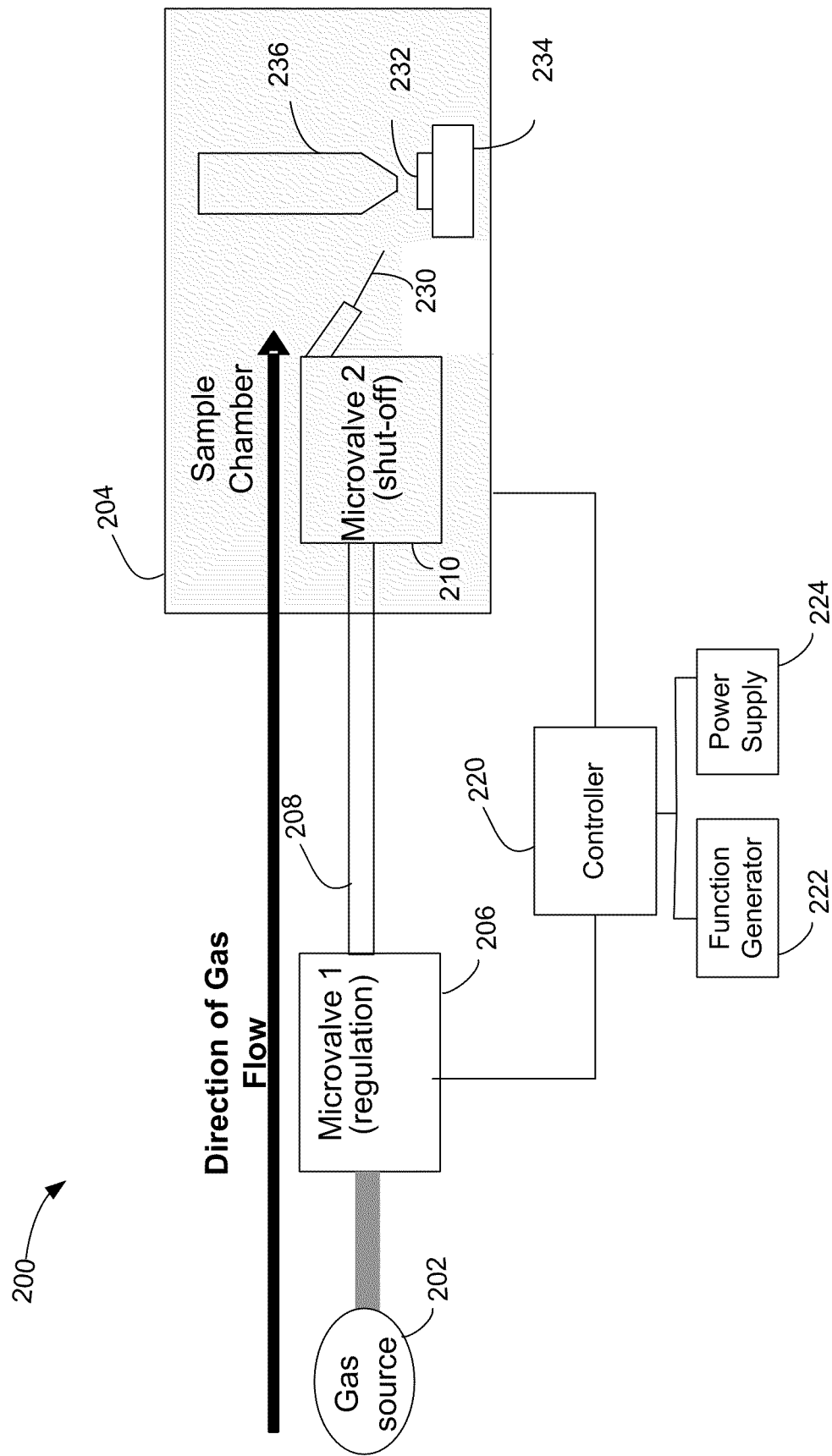
FIG. 2 shows schematically a preferred system for regulating pressure in a gas injection system.

FIG. 2 shows a schematic of the gas path of one gas of a typical beam system 200 of the present invention. A gas source 202 provides a gas to a beam system chamber 204 through a first valve 206 connected by a gas line 208 to a second valve 210 positioned within the sample chamber 204. Valves 206 and 210 are preferably microvalves, that is, small valves that control flow by adjusting the fraction of time that the valve is open, rather than by throttling the gas flow. First valve 206 is used to regulate gas flow to beam system 204 and second valve 210 is used as a shut-off valve to stop flow to system chamber 204 in case of failure of first valve 206. Placing the second valve, the shut-off valve, close to the point where gas is injected into the sample chamber reduces the time required to purge the gas from the chamber, because there is less gas in the lines to be purged. Line 208 is preferably heated to maintain the precursor in a gaseous state. Additional regions along the gas flow path can also be heated. The microvalves can also be heated using spot heaters to prevent condensation in the microvalves.

Figure 3:
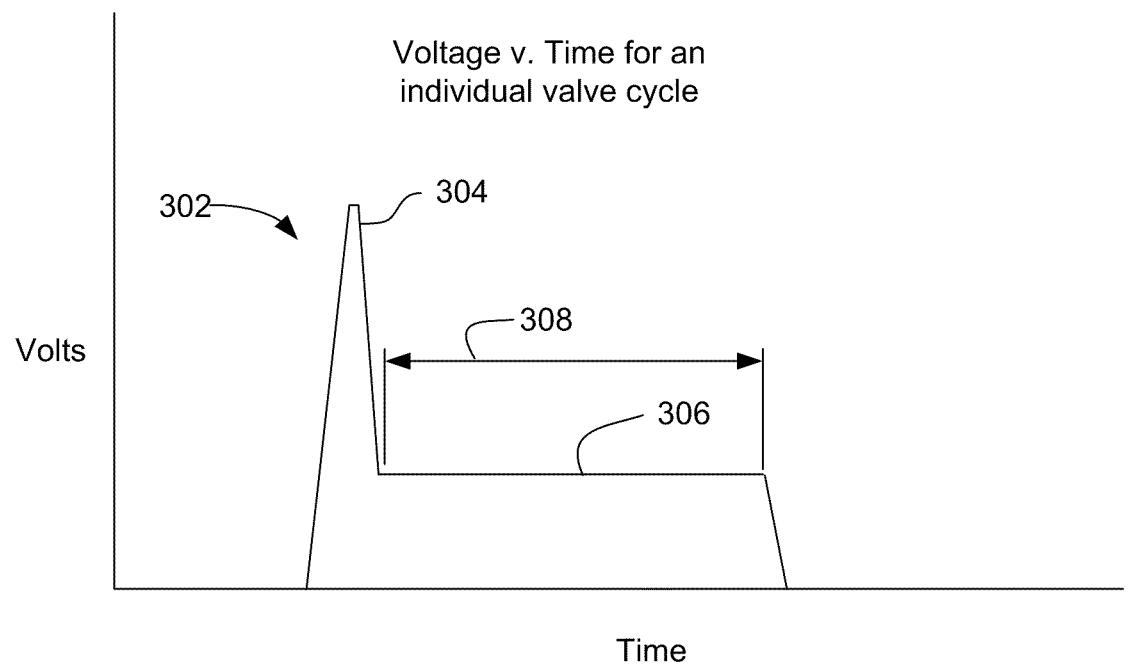
FIG. 3 shows a typical control signal for a cycling valve.

Valves 206 and 210 are controlled by controller 220 that combines a signal from a function generator 222 and power supply 224 to provide a drive signal for the valves. Valves 206 and 210 are preferably commercially available microvalves. Microvalves typically comprise a solenoid that opens a valve against a spring force that biases the valve in the closed position. When a current is passed through the coils of the solenoid, a plunger in the solenoid moves away from a valve seat to allow gas to pass though the seat. When the current is removed, the spring returns the plunger to the seat to seal the gas inlet. FIG. 3 shows a typical drive signal 302 that includes an initial voltage pulse 304, typically about 12 volts (V) for about 100 milliseconds (ms), that provides an initial impulse to open the valve, and a "hold" voltage 306, typically about 3-5 V, that is sufficient to maintain the valve in an open position. Both the pulse width 308 of the "hold" signal 306 and the frequency, that is, the number of cycles per second, are controllable. Controller 220 sets the duration and height of the initial pulse 304, and then switches the solenoid voltage to the hold voltage 306 for a programmed amount of time.

In a preferred embodiment, the time required for the gas in the sample chamber to reach the desired pressure of the gas pressure is controlled by setting pulse width 308, and the gas pressure maintained in the chamber is regulated by adjusting the frequency of each cycle. That is, pulse width 308 can be set so that the valve stays open for a longer period of time during each cycle so that the chamber pressure rises more rapidly. The rate at which the valve alternates between open and closed is adjusted to provide the desired pressure in the sample chamber. If the frequency is too low, the pressure in the chamber will oscillate; the frequency should be sufficiently high to maintain sufficient uniformity of pressure in the vacuum chamber. Such a pulse width modulation (PWM) control scheme can be used to provide flow control, and hence pressure control, over the complete pressure range of the system.

Figure 4:
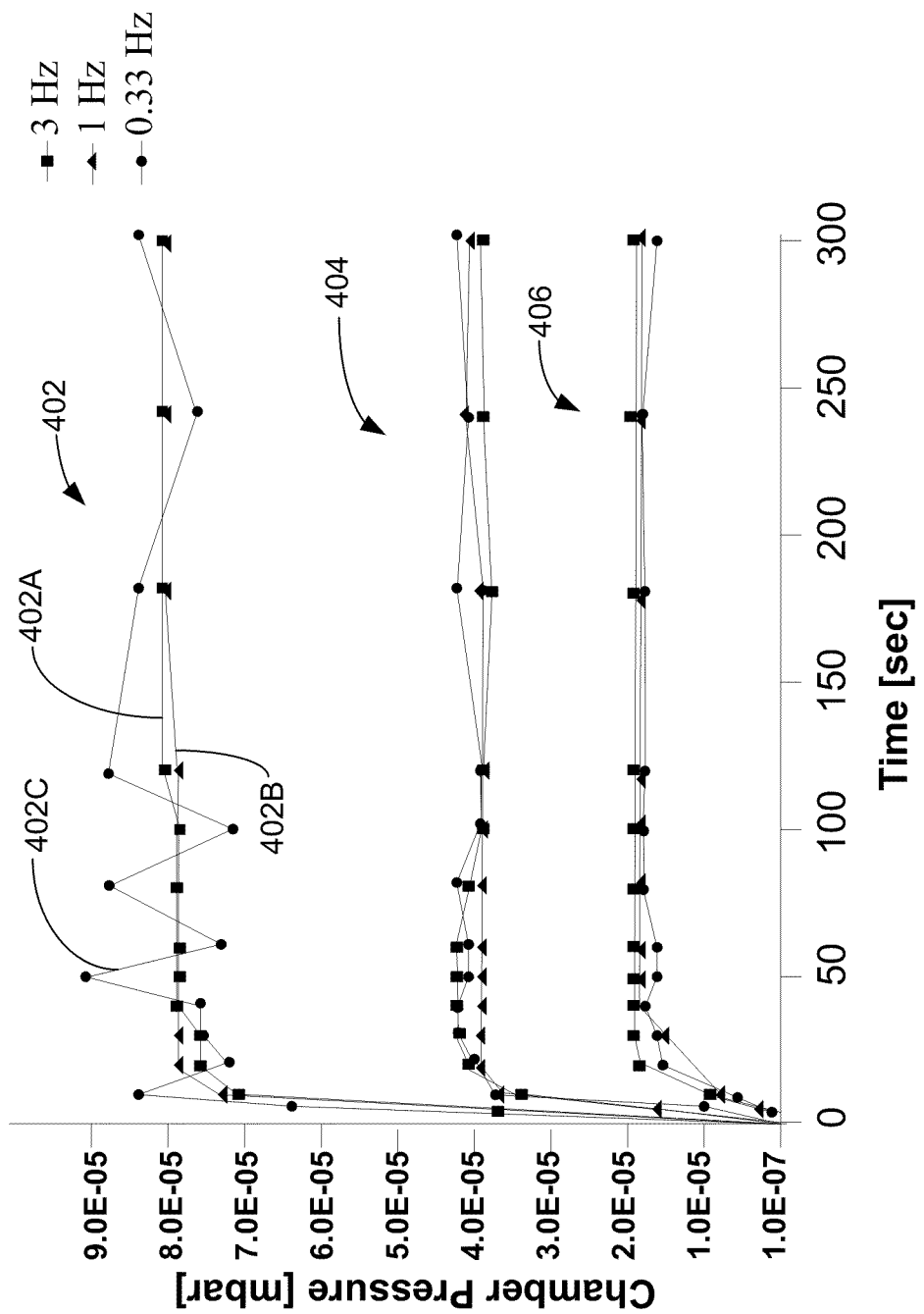
FIG. 4 shows chamber pressure versus time for different valve duty cycle and frequencies.

FIG. 4 shows how the operating frequency and duty cycle affect the chamber pressure over time. Data points represented by round dots represent a frequency of ⅓ Hz; data points represented by triangle represent a frequency of 1 Hz; and data points represented by squares represent a frequency of 3 Hz. The three lines grouped together and indicated by reference number 402 represent a duty cycle of 25%, that is, the valve is open for 25% of the time and closed for 75% of the time of each cycle. The three lines indicated by reference number 404 represent a duty cycle of 9.9%, and the three lines indicated by reference number 406 represent a duty cycle of 3%. Lines 402 show that a duty cycle of 25% produces a chamber pressure of about 7.7×10$^{-5}$ millibar (mbar). The line 402A corresponding to a frequency of 3 Hz shows that the pressure is relatively stable, whereas the line 402C corresponding to a frequency of ⅓ Hz shows significant fluctuations in the chamber pressure. Lines 404 show that a duty cycle of 9.9% produces a pressure in the vacuum chamber of about 3.9×10$^{-5}$ mbar and lines 406 show that a duty cycle of 3% produces a pressure in the vacuum chamber of about 1.9×10$^{-5}$ mbar. Note that the duty cycle is related to the frequency, as well as the pulse width.

Figure 5:
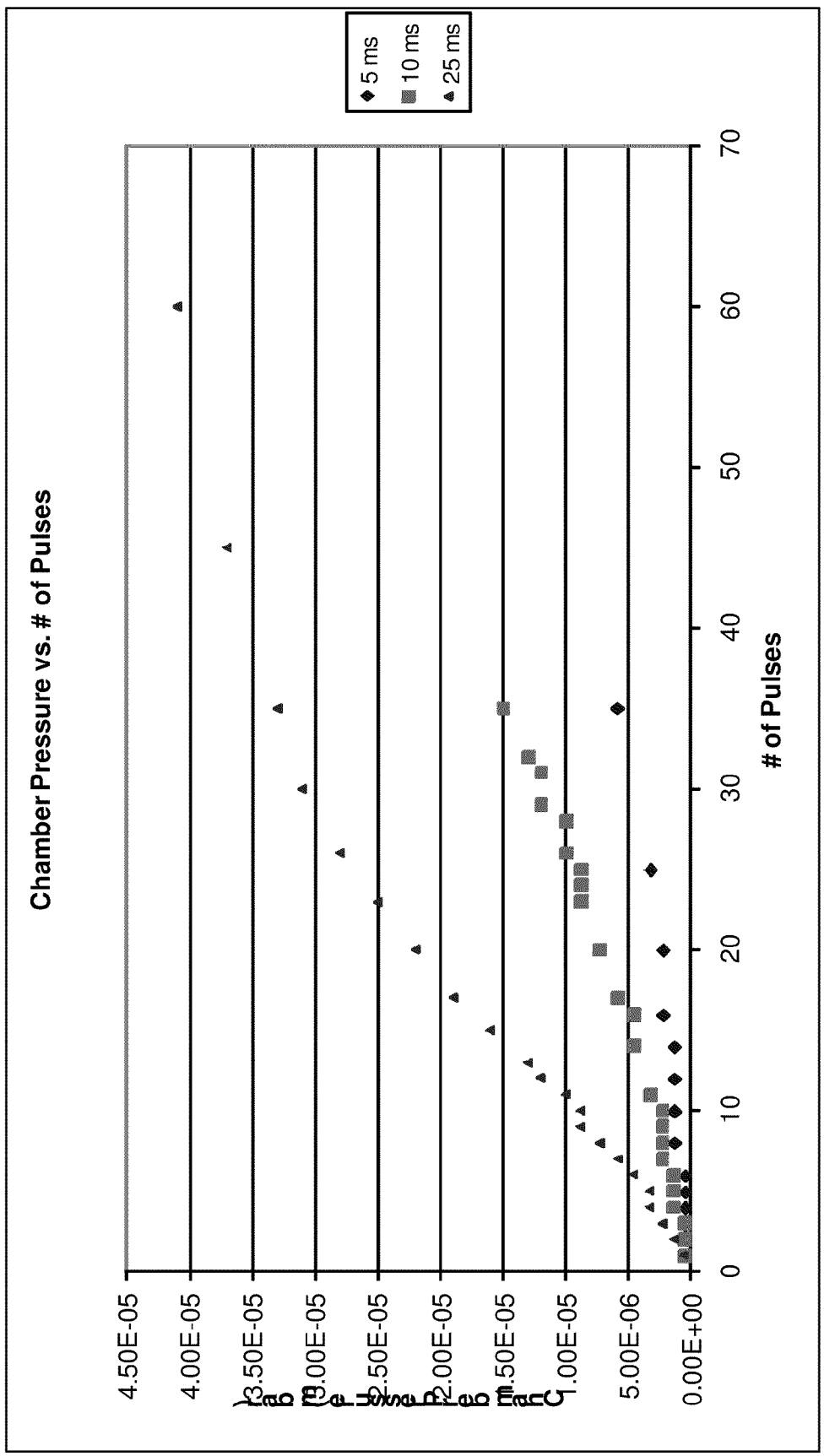
FIG. 5 shows chamber pressure versus number of pulses for different pulse widths of the valve control signal.

FIG. 5 shows how the pressure increases in the chamber as a valve is pulsed. The data points indicated by the diamonds represent 5 ms pulses, that is, the valve was open for about 5 ms during each cycle. The squares represent 10 ms pulses, and the triangles represent 25 ms pulses. FIG. 5 shows that longer pulse durations increase the chamber pressure more rapidly for the same number of pulses, and that the increase is greater than would be expected based solely on the time the valve is open.

Figure 6:
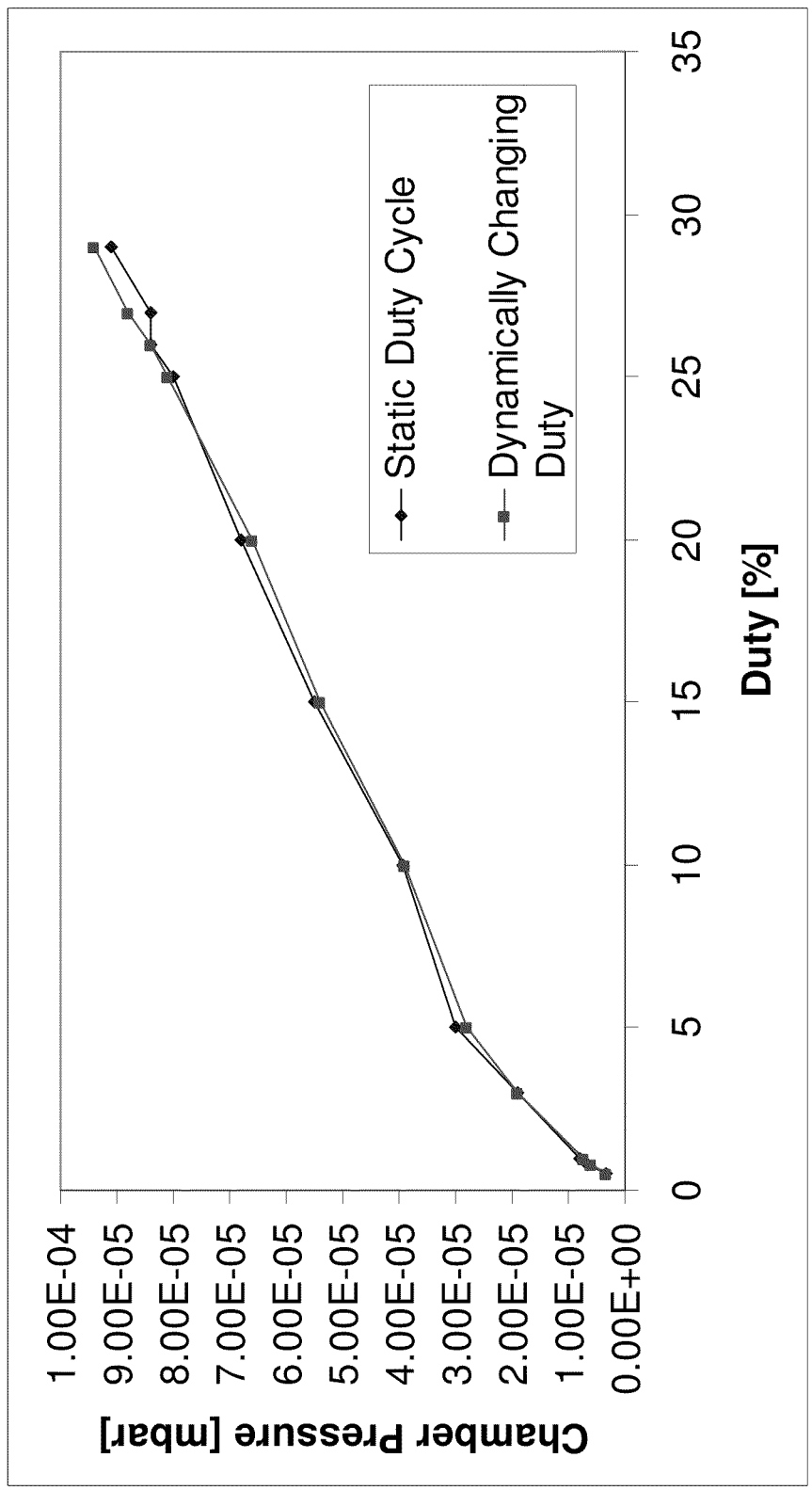
FIG. 6 shows chamber pressure versus duty cycle for a static duty cycle and dynamically changing duty cycle.

FIG. 6 shows how the chamber pressure changes when the duty cycle remains constant, compared to when the duty cycle is dynamically changed.

Figure 7:
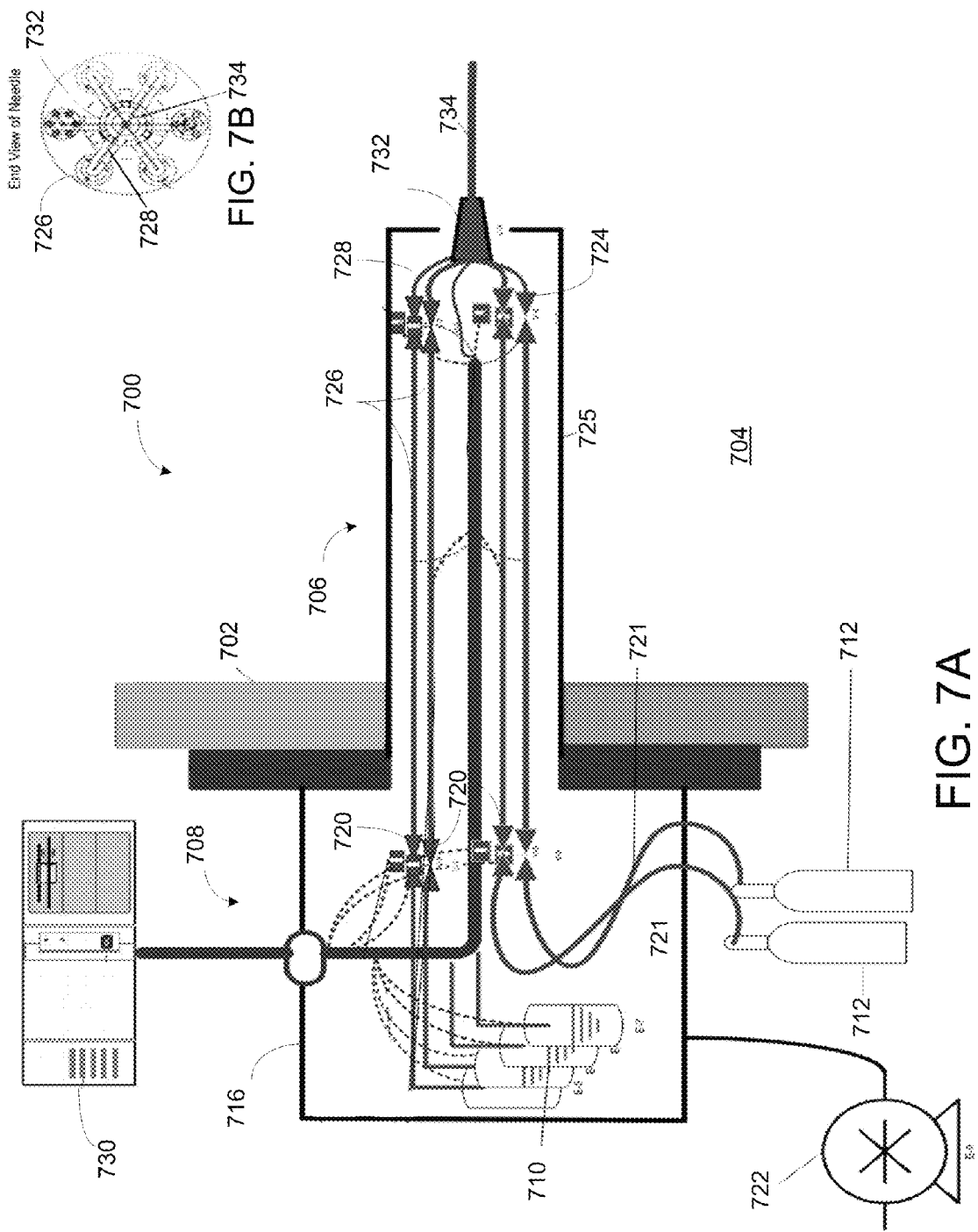
FIG. 7A shows schematically a preferred embodiment of a GIS of the present invention.
FIG. 7B shows the nozzle portion of the embodiment of FIG. 7A.

FIG. 7A shows an embodiment of a gas injection system (GIS) 700 in accordance with the present invention. Gas injection system 700 extends through a wall 702 into a vacuum chamber 704 and so includes a portion 706 inside the vacuum chamber 704 and a portion 708 outside the vacuum chamber 704. System 700 includes two types of gas sources, solids and liquids in containers 710, described in more detail below, and gas tanks 712. The gas sources 710 and 712 are in portion 708 external to the vacuum chamber 704 so that they can be easily replaced when empty. Positioning the gas source outside of the vacuum chamber also allows for the use of larger capacity containers. An airtight cabinet 716 maintains the containers 710 and control valves 720 within a vacuum environment. In some embodiments, the gas source, such as one of containers 710, which may be, for example, a crucible containing a solid or liquid precursor material, is contained entirely within the interior of airtight cabinet 716, rather than having a portion that extends outside the airtight cabinet. This can simplify the design of the crucibles or other gas sources. Airtight cabinet 716 is connected to the vacuum in sample chamber 704, but can be vacuum isolated by closing a valve (not shown) to facilitate replacing or refilling containers 710.

Each of cylinders 712 is connected to a valve 720 by a high pressure line 721. Maintaining the gas source outside of the sample chamber provides space for multiple gas sources and reduces the space required within the vacuum chamber, leaving room for other instruments. A forepump 722 is used to evacuate chamber 716. Forepump 722 speeds evacuation of cabinet 716 after changing gas containers 710 eliminating the time required for gas in cabinet 716 to diffuse into the sample chamber 704 and be evacuated from there.

Cabinet 716 provides a secondary gas containment structure, in case of a leak from one of the gas sources, eliminating the need for separate vented storage boxes. Many beam systems are constructed using multiple ports for attaching instruments and tools to the sample chamber. There are a limited number of such ports. The invention allows multiple gases to be inserted through a single GIS port, thereby providing the capability of supplying multiple gases to existing sample vacuum chambers having a single free port.

As described above with respect to FIG. 2, valves 720 will use, for example, a pulse width modulation control scheme to regulate the gas flow and second valves 724 are shut-off valves in case the first pressure control valve fails. Valves 724 can also be used to provide a quick chamber pressure recovery when the chamber has been evacuated and it is desired to rapidly bring the gas pressure to a desired level. Heated gas lines 726 connect valves 720, positioned in cabinet 716, with valves 724, positioned in portion 706 that extends into the sample chamber 704. Lines 726 extend from vacuum cabinet 716 through an opening in the wall 702 of vacuum chamber 704, so that valves 724 are in portion 706, that is, within the interior of vacuum chamber 704.

Much of portion 706 is surrounded by a shield 725, preferably composed of a mu-metal to prevent magnetic fields generated by valves 724 from affecting the charged particle beam. Gas lines 726 may be, for example, a ⅛-inch diameter Teflon® tube incorporating a resistive heater and integrated resistive thermal device for measuring the gas line temperature. The heated flexible gas lines allow routing of the gas lines around obstacles. A controller 730, such as a programmable logic controller, uses the temperature measurement device in the gas lines to provide feedback to the resistive heaters to maintain an appropriate temperature in gas lines 726 to ensure that the gas does not condense before reaching the sample chamber. Controller 730 also controls valves 720 and 724. In some embodiments, a heater is positioned near valves 720 and valves 724 to maintain the precursor in a gaseous state.

The outlet lines 728 of valves 724 feed into a funnel-shape nozzle 732 that ends in needle 734, which can be inserted near a work piece (not shown) or retracted away from the work piece when not in use. FIG. 7B shows an end view of the nozzle region of GIS 700 and shows the relationship of the parts described above with respect to FIG. 7A. The system shown in FIGS. 7A and 7B is compatible with solid, liquid, and gaseous sources. Bottles 710 and gas cylinders 712 provide for easy refilling outside the sample chamber and do not require a fume hood. As shown in FIG. 7A, each gas container 710 preferably has its own corresponding valve 720, line 726, valve 724, and line 728 into 732. This differs from some of the prior art that includes a single main line fed by multiple gas sources. Having individual lines for each gas source and having a valve near the exit point of the gas into the sample chamber 704 makes changes changing gases more efficient because it is not necessary to purse a main line, and very little gas remains in the system after the valve is closed to stop the gas flow.

Micro-valves 724 typically generate magnetic and electric fields that can interfere with a charged particle beam, such as an electron beam or an ion beam, being used to process the work piece. Shield 725 is preferably made from a mu-metal material and is positioned to shield the charged particle beam from the magnetic and electrical fields of the valves 724, which field would change the beam impact point on the work piece. The mere presence of the shield 725 affects the trajectory of the charged particles. The effect is minimal because the shield 725 is relatively far from the charged particle beam column, but the effect can be compensated by adjustments to stigmators in the charged particle beam when tuning the charged particle beam column before use. Because the voltages on the stigmators would need to adjust if shield 725 is moved, the shield is preferably maintained in a fixed position, and only the non-magnetic needle 734 is inserted or retracted.

In the prior art, flow-limiting apertures were required to reduce gas flow to maintain the desired pressure in the sample chamber. These apertures reduce the ability to rapidly bring the chamber to the required pressure and reduce the range of pressures achievable in the sample vacuum chamber. The pressure achievable in the sample chamber was often limited by the GIS. The cycling valves of the present invention eliminate the need for a flow-limiting aperture and can therefore provide a much greater range of flow rates, and accordingly, a greater range of pressures in the vacuum chamber. An operator can set the pressure to a value that is only limited by the vacuum required in the chamber.

Unlike prior art cassette systems that work best for low volatility solids and liquids and can not handle gases that are in a gaseous state at room temperature, embodiments of the present invention provide the ability to supply all types of process gases into the sample vacuum chamber. Moving the chemicals outside the system vacuum chamber provides for quicker, easier refills and switching of chemicals. In a preferred embodiment, precursor gases flow from gas containers 710 through the system to needle 734 without requiring a carrier gas to carry the precursor gas through the system.

While embodiments of the present invention provide for conducting multiple gases into a vacuum chamber through a single GIS port, multiple ports may be used in other embodiments. Skilled persons will recognize that the system described herein will permit gases from multiple sources to flow to nozzle 732 at the same time, thereby allowing multiple precursor gases to be provided at the sample surface at the same time.

Figure 8:
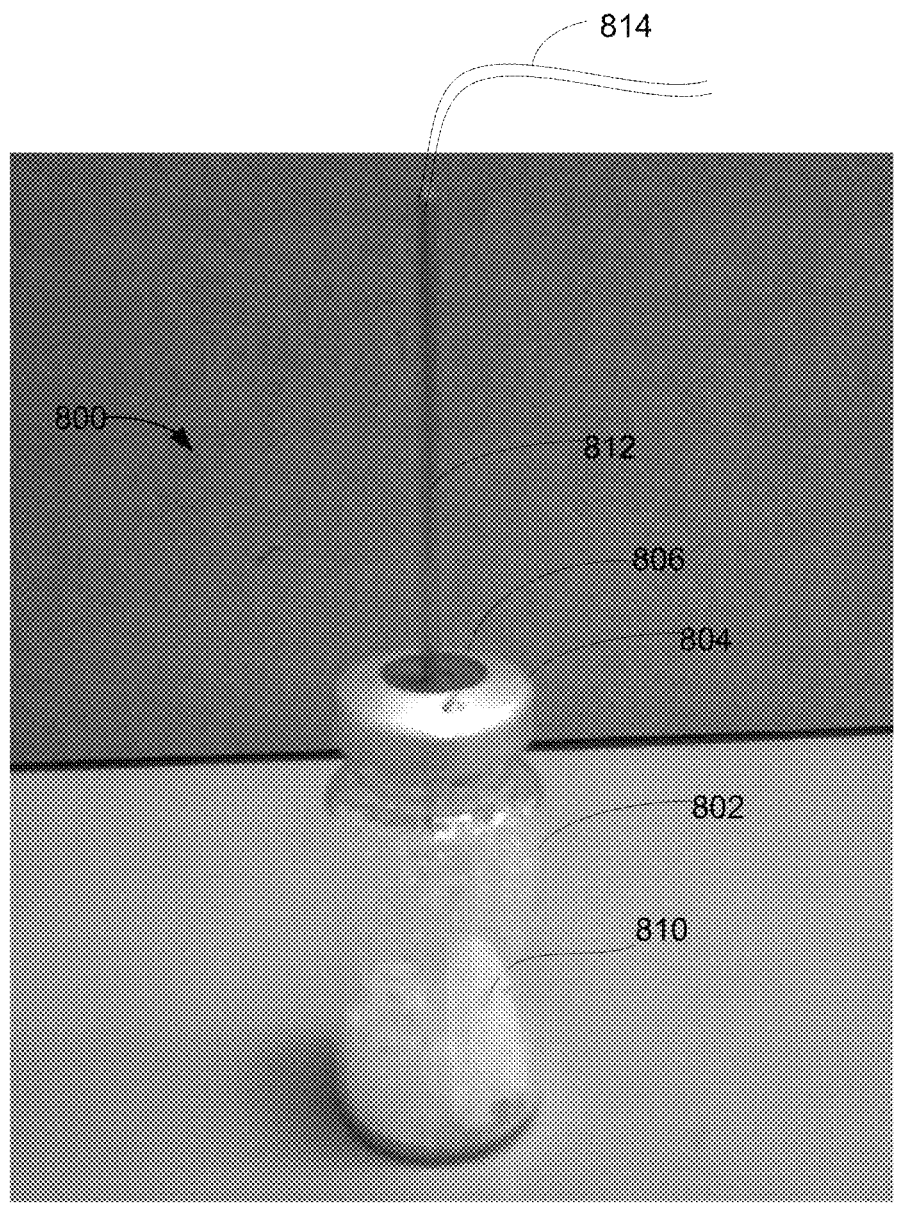
FIG. 8 preferred supply bottle used to provide a precursor gas in accordance with a preferred embodiment of the invention.

FIG. 8 shows a preferred embodiment of a gas supply container 800, which includes a bottle 802, typically made of glass, to which is threaded a sealing ring 804 that provides an airtight seal between bottle 802 and a sealing membrane 806. Bottle 802 contains a solid or liquid precursor gas source 810. Gas supply container 800 may be a septum bottle, similar to containers used in the medical field for serums. Container 800 is connected to the gas injection system by piercing sealing member 806, typically a high-quality Teflon-silicone septum, with a hollow tube, such as needle 812 connected by a gas conduit 814 that leads into a valve (not shown) in the GIS. For example, the bottle 802 may contain for example, $XeF_2$, $W(CO_6)$, Napthelene, TEOS, Iodine, or Trimethyl(methylcyclopentadienyl)platinum. When bottle 802 is empty, needle 812 is withdrawn, and sealing member 806 closes the needle hole, forming a gas-tight seal that seals in any residual contents. Supply containers 800 can be changed out without a fume hood and are compatible with both liquid or solid precursors. Other types of seals can be used, such as quick-release fittings.

A preferred method of using gas supply container 800 to provide a precursor gas for a microbeam system comprises providing a bottle having a sealing membrane and containing a solid or liquid material that produces a process gas, the membrane maintaining the solid or liquid material in the bottle; inserting into the bottle a hollow tube that is connected by a gas conduit to a valve that controls the flow of precursor gas from the bottle to a nozzle, the insertion of the tube allowing gas to flow past the membrane; and directing gas from the nozzle to the surface of a sample in a vacuum chamber.

In preferred embodiments of the gas injection system, pressure in the vacuum chamber can be controlled from between about $1\times10^{-6}$ mbar to $1\times10^{-4}$ mbar to within an accuracy of about $1.5\times10^{-6}$. Microvalves may be integrated into a relatively small amount of space in the GIS, and provide rapid response and control.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A gas injection system for providing multiple process gases to a microbeam processing system having a sample chamber with a controlled environment, comprising:
   multiple gas sources for providing multiple process gases;
   a plurality of flow rate control valves, each flow rate control valve associated with one of the multiple gas sources to adjust the flow rate of gas from the corresponding gas source;
   a plurality of shut off valves, each shut off valve associated with one of the multiple gas sources and positioned inside the sample chamber;
   a set of first gas conduits, each first conduit conducting gas from one of the flow rate control valves to the corresponding shut off valve;
   a set of second gas conduits, each second gas conduit conducting gas from the corresponding shut off valve into the controlled environment in the sample chamber; and
   an airtight cabinet extending through the wall of the sample chamber and connected to the controlled environment in the sample chamber, the airtight cabinet maintaining at least some of the multiple gas sources, the plurality of flow rate control valves, and the plurality of shut-off valves, in the controlled environment during operation and the airtight cabinet being isolatable from the sample chamber for replacing or refilling gas source;
   in which there are no intervening valves between the shut off valve and the controlled environment in the sample chamber.

2. The gas injection system of claim 1 in which all of the second gas conduits provides gas to common nozzle for directing the process gases toward a sample.

3. The gas injection system of claim 1 in which the multiple gas sources include materials that are solid at room temperature and materials that are liquid at room temperature.

4. A microbeam processing system for providing process gases to a sample chamber having a controlled environment, comprising:
   a sample chamber for processing a work piece in the controlled environment;
   a gas injection system including:
   a plurality of gas sources, each gas source for providing a process gas;
   a plurality of flow rate control valves, each flow rate control valve associated with one of the plurality of gas sources to adjust the flow rate of the process gas from the gas source;
   a plurality of shut off valves, each shut off valve associated with one of the plurality of gas sources and positioned inside the sample chamber;
   a plurality of first conduits, each first conduit conducting gas from one of the flow rate control values to the corresponding shut off valve;

a plurality of second conduits, each second conduit conducting gas from one of the shut off valves into the controlled environment in the sample chamber; and an airtight cabinet extending through the wall of the sample chamber and connected to the controlled environment in the sample chamber, the airtight cabinet maintaining at least some of the plurality of gas sources, the plurality of flow rate control valves, and the plurality of shut-off valves, in the controlled environment during operation and the airtight cabinet being vacuum isolatable from the sample chamber for replacing or refilling gas source;

in which there are no intervening valves between the shut off valve and the controlled environment of the sample chamber.

5. The microbeam processing system of claim 4 in which the flow rate control valve is a cycling valve, adapted to control a rate of fluid flow by alternating between an open position and a closed position.

6. The microbeam processing system of claim 5 in which the flow rate control valve is adapted to alternate between the open position and the closed position at a rate of greater than once per second.

7. The microbeam processing system of claim 5 in which the flow rate control valve is a driven by a pulse width modulated electric signal.

8. The microbeam processing system of claim 4 in which the shut off valve is a cycling valve, adapted to control fluid flow by alternating between an open position and a closed position.

9. The microbeam processing system of claim 4 further comprising a controller for controlling the operation of the flow rate control valve and shut off valve, the controller programmed to use the flow rate control valve to adjust the flow rate of the process gas and to use the shut off valve as a shut-off valve.

10. The microbeam processing system of claim 4 further comprising a controller for controlling the operation of the flow rate control valve, the controller programmed to control the rate of increase in the sample chamber gas pressure by controlling the length of time in which the valve is open during each cycle and in which the controller is programmed to control the pressure in the sample chamber by controlling the number of cycles per second.

11. The microbeam processing system of claim 4 in which the beam source comprises a charged particle beam column or a laser system.

12. The microbeam processing system of claim 4 in which the flow rate control valve comprises an electromagnet that causes a plunger to close and open the valve.

13. The microbeam processing system of claim 4 in which the flow rate control valve comprises a piezoelectric microvalve.

14. The microbeam processing system of claim 4 further comprising a nozzle for directing the process gas at the sample inside the sample chamber.

15. The microbeam processing system of claim 4 in which the process gas comprises a precursor gas, a carrier gas, or a purging gas.

16. The microbeam system of claim 4 in which at least one of the gas sources includes a tank positioned outside the cabinet.

17. The microbeam system of claim 4 in which at least one of the gas sources in the airtight cabinet includes a bottle having a sealing membrane and containing a solid or liquid material that produces a process gas.

* * * * *